United States Patent [19]
Kino et al.

[11] Patent Number: 5,375,175
[45] Date of Patent: Dec. 20, 1994

[54] METHOD AND APPARATUS OF MEASURING LINE STRUCTURES WITH AN OPTICAL MICROSCOPE BY DATA CLUSTERING AND CLASSIFICATION

[75] Inventors: Gordon S. Kino; Stanley S. Chim, both of Santa Clara County, Calif.

[73] Assignee: The Board of Trustees of the Leland Stanford Junior University, Stanford, Calif.

[21] Appl. No.: 847,173

[22] Filed: Mar. 6, 1992

[51] Int. Cl.$^5$ ............................................. G01B 11/02
[52] U.S. Cl. ................................. 382/8; 382/36; 356/384
[58] Field of Search ............... 382/8, 36; 356/358, 356/384, 387; 358/101; 348/135, 87, 79, 80, 126

[56] References Cited

U.S. PATENT DOCUMENTS

| | | | |
|---|---|---|---|
| 4,412,121 | 10/1983 | Kremers et al. | 358/107 |
| 4,794,647 | 12/1988 | Forgues et al. | 382/36 |
| 4,818,110 | 4/1989 | Davidson | 356/358 |
| 4,854,708 | 8/1989 | Kafri et al. | 356/359 |

OTHER PUBLICATIONS

S. Chim, J. Berman, & G. Kino, *An Interferometric Correlation Microscope,* MICRO 90, London, 2-6 Jul., 1990, Ch. 8.

C-H. Chou, J. Berman, S. Chim, T. Corle, G. Xiao & G. Kino, *Pattern Recognition Approach to Trench Bottom-width Measurement,* SPIE's Symp on Microlithography, San Jose, Calif. 3-8 Mar. 1991.

S. Chim & G. Kino, *Correlation Microscope,* Optics Letters vol. 15 No. 10, May 15, 1990.

G. Kino & S. Chim, *Mirau Correlation Microscope,* Applied Optics vol. 29 No. 26, Sep. 10, 1990.

G. Knio, Scanning Optical Microscopy, J. Vac. Sci. Technol. B 8 (6), Nov./Dec. 1990.

*Primary Examiner*—Joseph Mancuso
*Assistant Examiner*—Steven P. Klocinski
*Attorney, Agent, or Firm*—Flehr, Hohbach, Test, Albritton & Herbert

[57] ABSTRACT

A method of processing images obtained with a microscope along a line on an object, in which the object, having trenches or lines, is moved in the z direction to form a cloud plot; signals in the z direction are scanned to form a linescan vector; the linescan vectors are clustered and classified; a centroid is defined; a similarity curve is created from the linescan vectors and the centroids; and the distance between adjacent points on the similarity curve are measured to provide a measure of line or trench width.

21 Claims, 7 Drawing Sheets

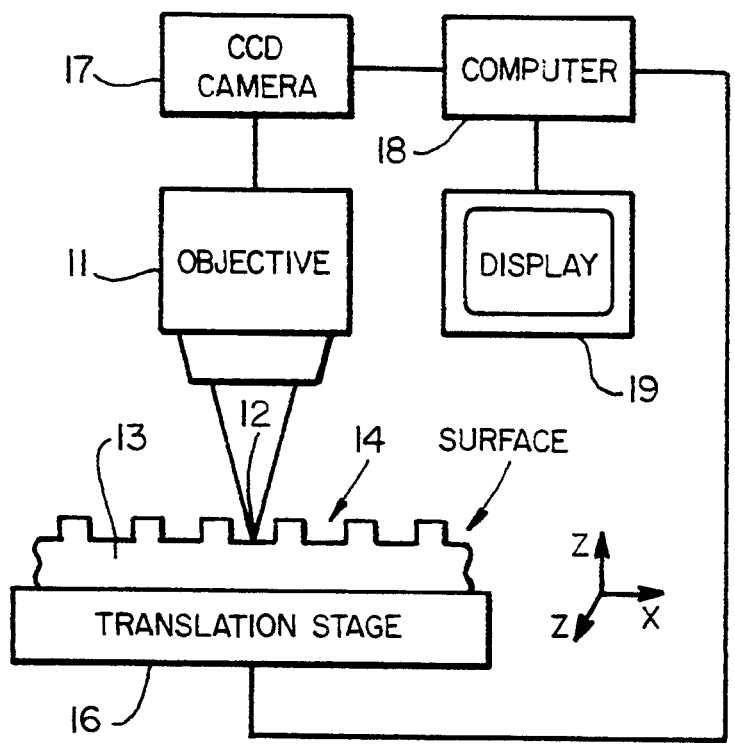
FIG_1
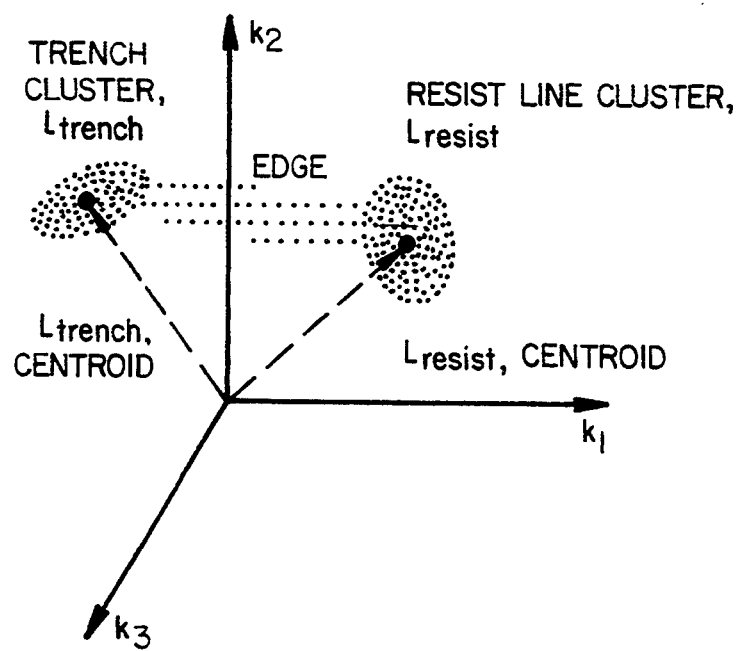
FIG_4

CONFOCAL IMAGE
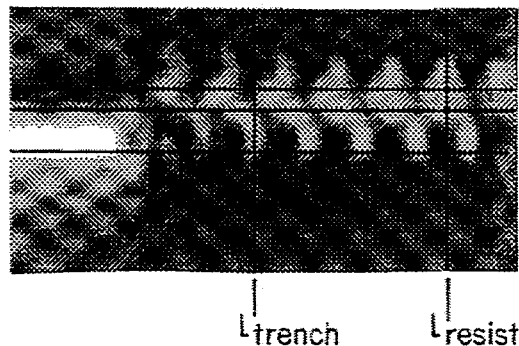
FIG_2A
COHERENCE IMAGE
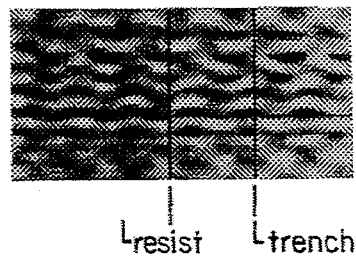
FIG_2B
INTENSITY IMAGE
FIG_2C

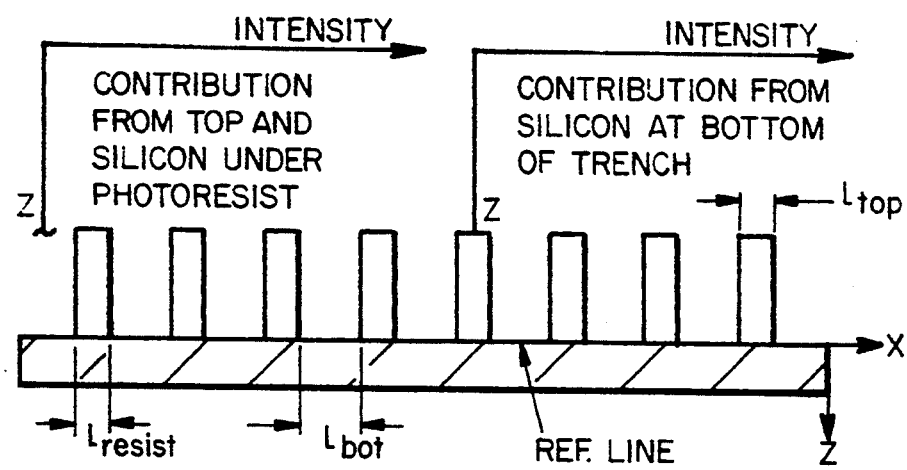
FIG_3A
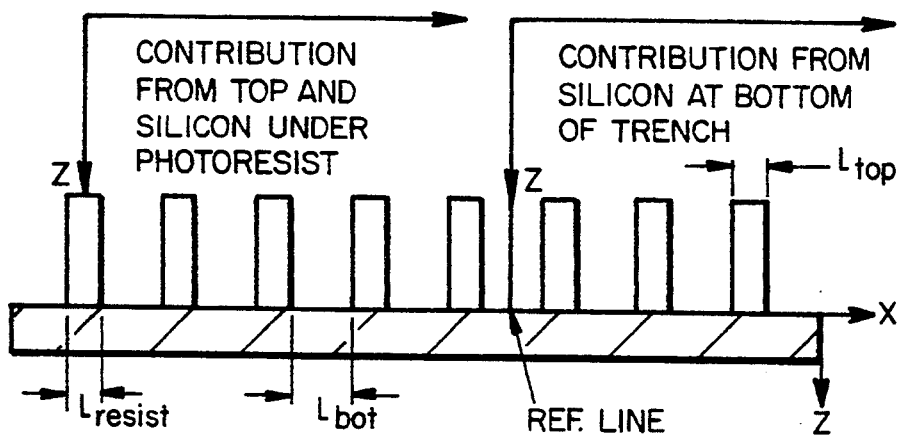
FIG_3B
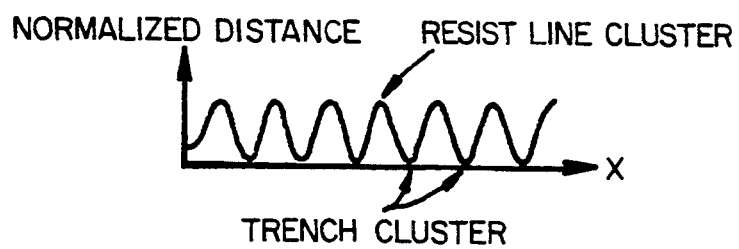
FIG_3C

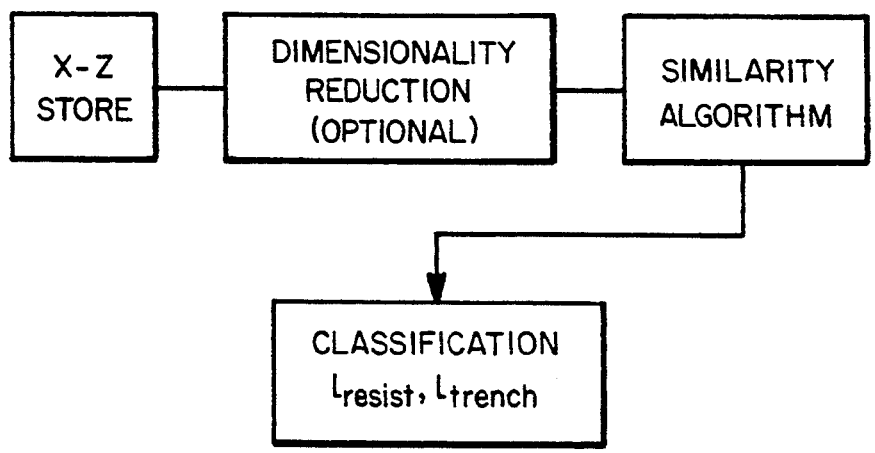
FIG_5
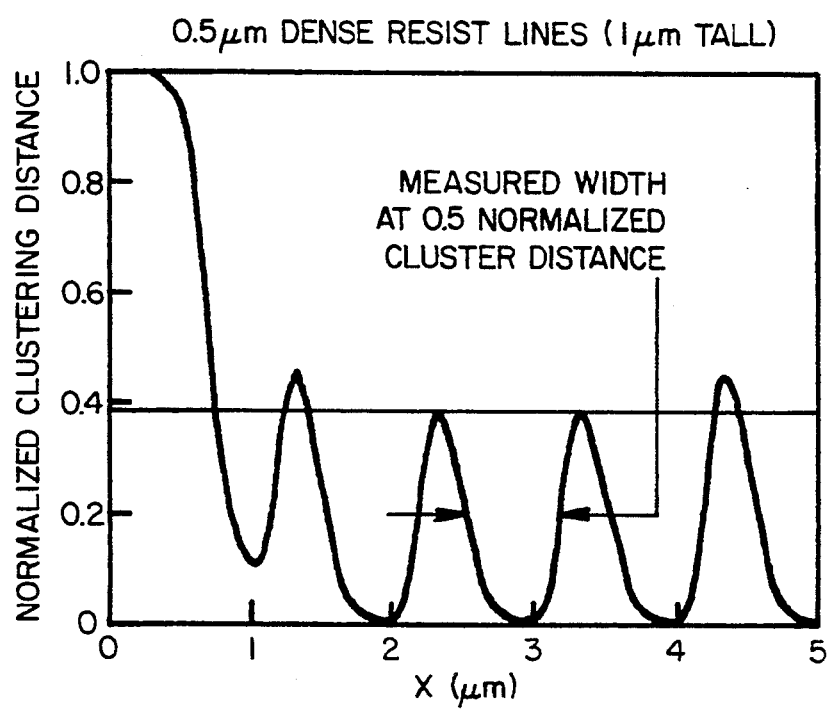
FIG_6

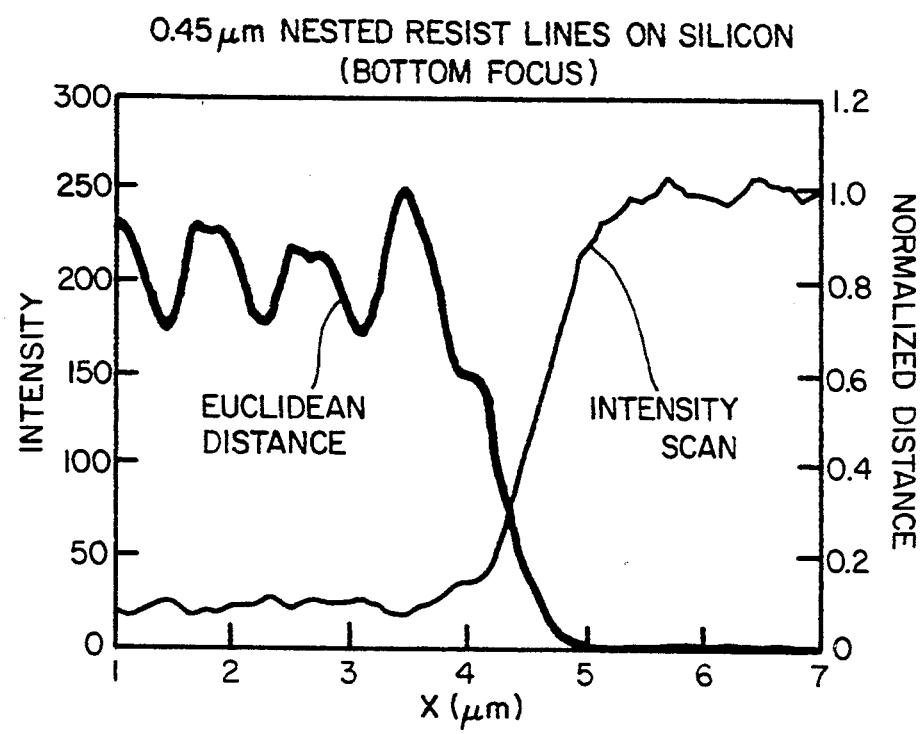
FIG_7
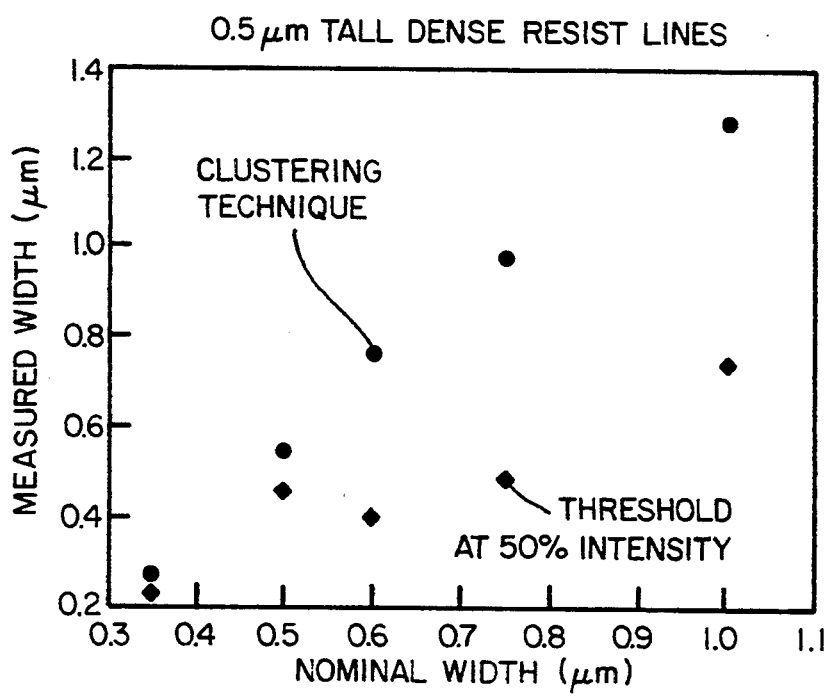
FIG_8

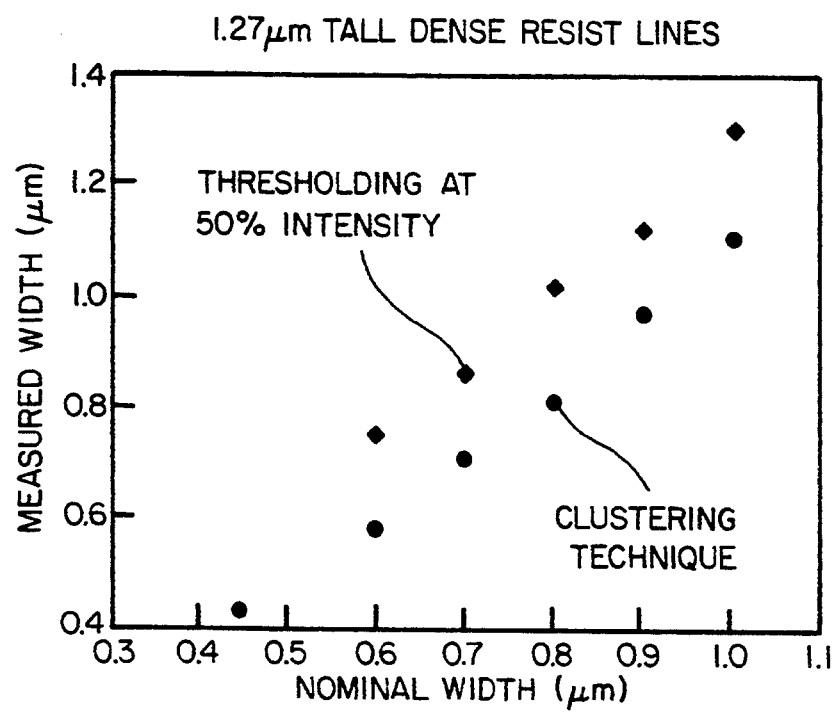
FIG_9
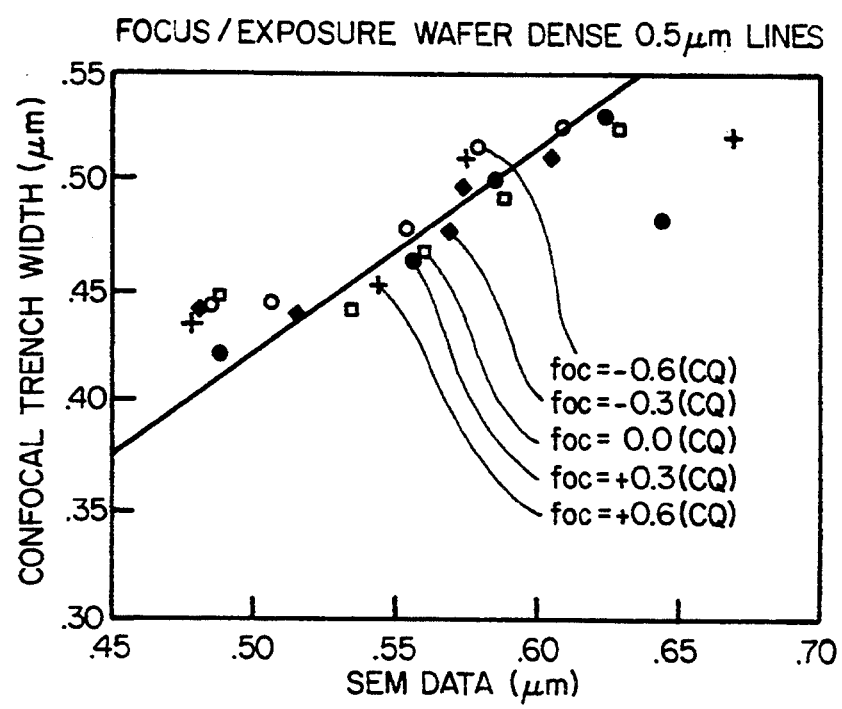
FIG_10

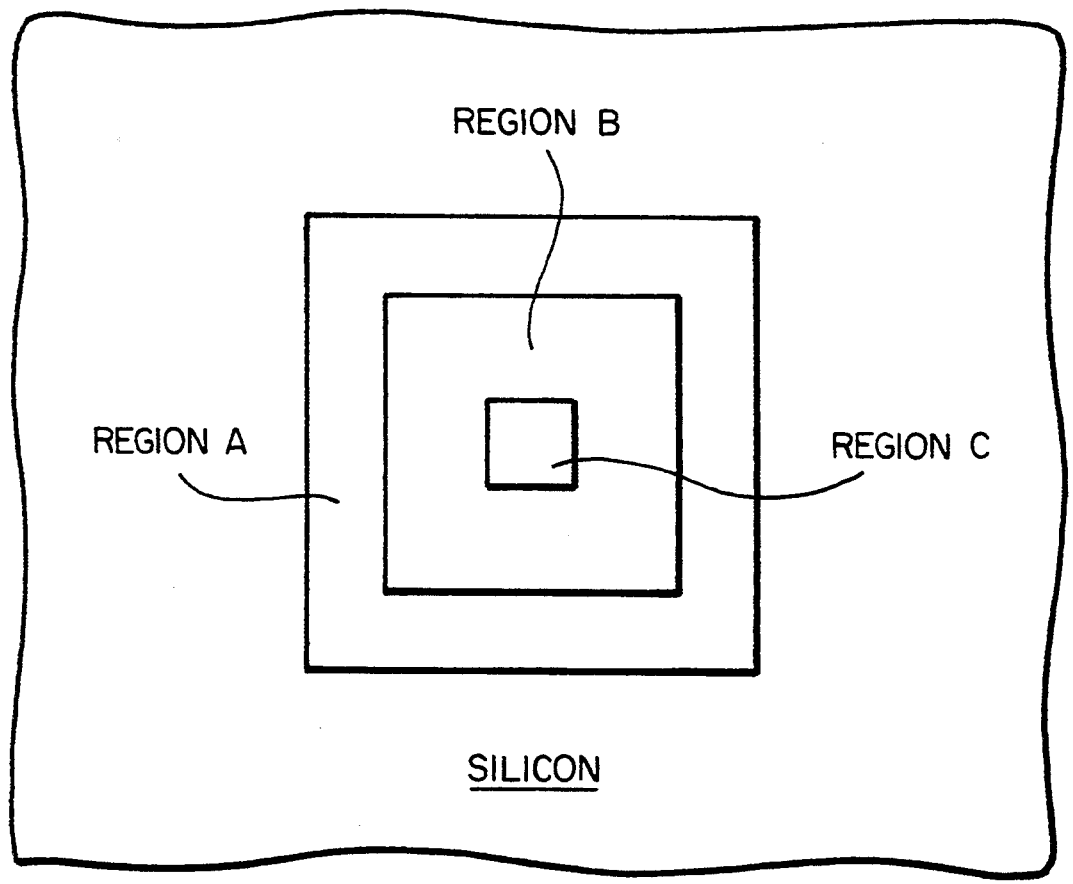
FIG_11A
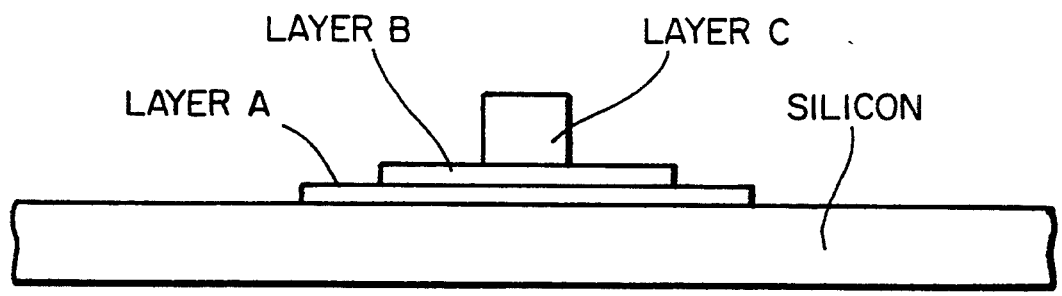
FIG_11B

METHOD AND APPARATUS OF MEASURING LINE STRUCTURES WITH AN OPTICAL MICROSCOPE BY DATA CLUSTERING AND CLASSIFICATION

BRIEF DESCRIPTION OF THE INVENTION

This invention relates generally to a method of making submicrometer dimensional measurements of line structures such as found in semiconductor devices and the photolithographic method used in making such structures using confocal and correlation microscopes. More particularly, the invention relates to a method of processing data representing intensity as a function of horizontal position x at various z positions of the line structure by pattern recognition techniques to obtain a line-width measurement.

BACKGROUND OF THE INVENTION

Submicrometer dimensional measurement is essential for semiconductor processing. It is necessary to measure the width of a critical line structure, for example, the gate width of a transistor. More importantly, critical line-width measurements are often used to characterize VLSI processing steps. For example, in photolithography, the measured width is directly related to critical process parameters such as focus distances and exposure periods.

Traditional techniques based on thresholding of the intensity of an optical image taken with a standard optical microscope are not accurate enough for submicrometer measurements. By using a confocal or correlation microscope, good results for narrow trenches down to widths of 0.4 $\mu$m can be obtained. However, for photoresist lines and arrays of lines and trenches, the relation between measured line-width and nominal line-width is not always linear. Furthermore, in the latter case, it is sometimes difficult to pick out the width of lines less than 0.7 $\mu$m wide.

For critical dimensional measurements, one is usually interested in line-widths. Thus, instead of acquiring a whole two-dimensional image, one only needs to acquire a line-scan at the same x location on the object every time its focus position changes. FIG. 1 schematically shows a microscope objective 11 focused at a spot 12 with respect to an object 13 which includes a line structure 14 to be scanned. The object is placed on a stage 16 which can be moved in the x-y-z directions so that the focal spot impinges upon different surfaces and locations on the object. To obtain a linescan, the object is moved along a line in the x-direction so there is scanning in the x-directions and then stepped in the z-direction to scan another line at another elevation. The image acquired by the microscope is applied to a CCD camera 17 which digitizes the signals which are stored in a computer 18. The computer controls the positioning stage. In the preferred embodiment, the focal spot extends over an area to create an image of a plurality of lines of the line structure and the output of the CCD camera is lens scanned to give readings for the x-direction. The stage is only moved to observe a different area. In either embodiment, the signals can then be processed and displayed on display 19 as a cloud plot. The cloud plot is a gray scale display of intensity as a function of horizontal position x and axial focusing position z along a line. FIGS. 2A and 2B are examples of cloud plots of 0.5 $\mu$m wide dense resist structures recorded by a confocal microscope and a correlation microscope (the Mirau Correlation Microscope), respectively.

The traditional approach to line-width measurements is to plot the intensity of the cloud plot as a function of x at various focus planes, z, of interest. For example, as illustrated in FIGS. 3A and 3B, for a Mirau correlation microscope and confocal microscope, respectively, $L_{top}$ is the top width of the photoresist strips, $L_{bot}$ is the width at the trench bottoms and $L_{resist}$ measures the width of the resist strips at the substrate interface. We shall call the respective line scans (along x) at the top of the resist; the bottom of the trench and the bottom of the resist $l_{top}(x)$, $l_{bot}(x)$, and $l_{resist}(x)$, respectively. Typically, the width of the actual line is then taken to be the width between the ½ or ⅓ power points of linescans taken in the x direction at these positions in z. For the confocal microscope, the intensity linescan is used; while for the correlation microscope, the linescan can be taken at the transformed intensity image. FIG. 2C is the transformed intensity image of the cloud plot of FIG. 2B; it is equivalent to the intensity cloud plot for the confocal microscope. Typically, it is standard practice to take the width of the line to be the distance between the ½ or ⅓ power points of a linescan in the x direction at a fixed position z corresponding to either the top or bottom of a trench or line. It is difficult to determine in the cloud plot the exact axial locations where the linescans $l_{top}(x)$, $l_{bot}(x)$, and $l_{resist}(x)$ should be taken, as the absolute locations may shift due to optical waveguiding or resonance effects inside the line structures. The shapes of the lines $l_{top}(x)$, $l_{bot}(x)$, or $l_{resist}(x)$ may change as the true line-widths vary. Typically these regions are picked out by looking for the position of maximum intensity in a scan in the z direction, as illustrated in FIGS. 3A and 3B. Consequently, it is not easy to construct an automatic measurement algorithm which tracks the true line-width consistently.

SUMMARY OF THE INVENTION

Accordingly, it is an objective of this invention to provide a method of measuring based upon pattern recognition-data clustering.

It is another objective of this invention to provide a method of measuring which provides reproducible measurements from sample to sample without operator interpretation.

It is yet another objective of this invention to provide a measurement method which is applicable to both correlation microscopes and confocal microscopes.

This and other objects of the invention are achieved by obtaining signals from a microscope from at least a plurality of locations on surfaces along a line, clustering the signals in the z direction into groups representing lines and trenches of the surface along the line, and creating a similarity curve which is a function of the position on the line wherein the minimum value represents lines or trenches and the maximum value represents trenches or lines, and measuring the distance between adjacent points on the curve along a selected line parallel to the maximum or minimum.

BRIEF DESCRIPTION OF THE DRAWINGS

The purpose and advantages of this invention will be apparent to those skilled in the art from the following detailed description in conjunction with the appended drawings, in which:

FIG. 1 is a schematic diagram of a microscope system for carrying out the method of the present invention.

FIG. 2A shows a cloud plot of a 0.5 μm wide dense resist structure obtained by a confocal microscope.

FIG. 2B shows a cloud plot of a 0.5 μm wide dense resist structure obtained by a correlation microscope.

FIG. 2C is a transformed cloud plot of the cloud plot of FIG. 2B.

FIGS. 3A and 3B show the contributions from top of a resist line, silicon under resist line and trenches to the signals at location x as a function of z.

FIG. 3C shows the normalized cluster representation of the resist and trenches of FIGS. 3A and 3B.

FIG. 4 shows the distribution in data clusters for $l_{trench}$ and $l_{resist}$.

FIG. 5 is a block diagram of the method of clustering in accordance with the invention.

FIG. 6 shows the results of the method in accordance with the present invention.

FIG. 7 is a comparison of results obtained using a conventional intensity linescan and the method of the present invention for measuring a dense resist 1 μm line structure.

FIG. 8 is a comparison of measurements of a 0.5 μm thick resist wafer with structures of varying widths.

FIG. 9 is a comparison of measurements of a 1.27 μm thick resist wafer with structures of varying widths.

FIG. 10 shows results obtained with a confocal microscope.

FIG. 11 illustrates use of the present invention to align structures.

DETAILED DESCRIPTION OF DRAWINGS

Referring to FIGS. 3A and 3B, it is observed that the two linescans are different in two respects: first, the envelope of the scan through the center of a photoresist line may experience two maximums due to reflections from the top of the resist and the substrate underneath while that through the center of a trench has only one maximum; second, the envelopes of these two scans are offset in z by an amount approximately equal to the resist thickness. We then classify all axial scans (scans along the vertical axis) $l_x(z)$ at location x by processing the storm signals into two groups, $l_{resist}$ and $l_{trench}$, according to a similarity measure, the location of the peaks in the z direction is used.

Each axial scan $l_x(z)$ may be thought of as a vector in N-dimensional space. The distribution of the two data clusters $l_{resist}$ and $l_{trench}$ is illustrated in FIG. 4 where, for simplicity, each vector $l_x(z)$ is considered as three dimensional. The signals from the resist line locations and the trench locations are clustered around the resist line cluster and the trench cluster, respectively, while the edges (or the transition region) are located between the two clusters. The centroids $l_{resist,centroid}$ and $l_{trench,centroid}$ of the two clusters $l_{resist}$ and $l_{trench}$ may be defined as shown in FIG. 4, which are very useful for data classification described below.

The signals $l_x(z)$ are usually represented by 64 or more data points corresponding to 64 or more steps of the surface in the z-direction after each image is taken in the x-y direction, and thus can be thought of as vectors of at least 64 dimensions. This is too much information for fast classification. To compress the information needed for classification one can take a Fourier transform of the linescans, $l_x(z)$, in the z direction, by writing (in continuous analog form):

$$l_x(k_z) = \int l_x(z) e^{-jk_z z} dz \qquad (1)$$

where $k_z$ is called the spatial frequency in the z direction.

After the Fourier transform, only about 6 Fourier components (or dimensions) are required, instead of 64 dimensions, to represent the same signal $l_x$. It should be noted that other transformations (for example, Walsh or Karhunen-Louve transformations) can also be used for dimensional reduction. With a Fourier transform, the magnitudes of the spectrums of $l_{resist}(k_z)$ and $l_{trench}(k_z)$ are related to the shape of their envelopes before the transform; the phase difference of the spectrums of $l_{resist}(k_z)$ and $l_{trench}(k_z)$ is related to the relative offset of their envelopes along the z-axis. The transformed signal $l_x(k_z)$ is now considered as a complex number so that both the amplitude and phase of the spectrum are used for classification.

In order to highlight the fact that all transformed signals of $l_x(z)$ (in which the Fourier transform signal $l_x(k_z)$ is one example) and even the original signal $l_x(z)$ may be used for the data clustering technique described in this disclosure, we will just use $l_x$ to represent the signal at location x, without writing the variables z or $k_z$ or any other transformed coordinates explicitly.

Up to now, the signals $l_x(z)$ are assumed to be single axial linescans of intensities representing a well defined focal point along the z-axis before Fourier transformation to spatial frequencies $k_z$ along the transformed z-axis. However, $l_x$ may also be taken as a region of linescans representing the focal area or spot along z or $k_z$ centered at a horizontal location x. For example, the regional signal $l_{xn}^R$ with width (2 m+1) points is expressed as a multidimensional vector:

$$l_{xn}^R = \begin{bmatrix} l_{x(n-m)} \\ l_{x(n-m+1)} \\ \cdot \\ \cdot \\ l_{xn} \\ \cdot \\ \cdot \\ l_{x(n+m-1)} \\ l_{x(n+m)} \end{bmatrix} \qquad (2)$$

where $l_{x(n-m)}$, $l_{x(n-m+1)}$, $l_{xn}$, $l_{x(n+m-1)}$ and $l_{x(n+m)}$ are just linescans along z or $k_z$ at locations $x = x_{n-m}$, $x_{n-m+1}$, $x_n$, $x_{n+m-1}$ and $x_{n+m}$, respectively. Since $l_{x(n-m)}$, $l_{x(n-m+1)}$, $l_{xn}$, $l_{x(n+m-1)}$ and $l_{x(n+m)}$ are all column vectors of the same dimension, $l_{xn}^R$ is now a column vector of dimension (2 m+1) times that of the previous column vector $1_{xn}$.

The advantage of using a regional signal $l_x^R$ over a line signal $l_x$ is that the contribution of the neighboring pixels of the focal spot $x_{n-1}$, $x_{n-2}$, etc. are taken into consideration in the representation of the signal at $x_n$. The underlying physical reason is that the point spread function of an optical microscope extends over a finite area on the sample so that the neighbors $x_{n-1}$, $x_{n-2}$, etc. have their contributions even though the beam is supposed to be focused at $x_n$. However, in order to emphasize the contribution from the focused point $x = x_n$, the vector $l_{xn}^R$ (Eq. 2) is weighted so that $l_{xn}$ is unity and $l_{x(n-m)}$, $l_{x(n-m+1)}$, $l_{xn}$, $l_{x(n+m-1)}$ and $l_{x(n+m)}$ are weighted (with weights less than 1) according to their distance from $x_n$. For example, the point spread function of the microscope may be used to assign the weights.

In the foregoing description it was stated that the axial linescans would be classified in groups representing $l_{trench}$ and $l_{resist}$ at the various $l_x$ locations. This is accomplished by a similarity measure. After a dimensional reduction by transformation (if so desired), the line signal $l_x$ or regional signals $l_x^R$ are clustered by a similarity measure. Some of the common similarity measures to measure the similarity between two vectors $l_1$ and $l_2$ at locations $x_1$ and $x_2$ are:

Dot Product $$l_1 \cdot l_2 = l_1^T l_2 = \sum_k l_1(k) l_2(k) \quad (3)$$

In a two-dimensional system if $l_1$ and $l_2$ are perpendicular, then $l_1 \cdot l_2 = 0$. In a multidimensional system $l_1 \cdot l_2$ is maximum when $l_1$ and $l_2$ lie along the same directions.

Similarity Rule $$S(l_1, l_2) = \frac{l_1 \cdot l_2}{(l_1 \cdot l_1) + (l_2 \cdot l_2) - 2(l_1 \cdot l_2)} \quad (4)$$

The denominator is zero when $l_1 = l_2$ and the numerator maximum when $l_1$ and $l_2$ lie in the same direction.

Weighted Euclidean Distance $$d(l_1, l_2) = \sqrt{\sum_k |l_1(k) - l_2(k)|^2 w_k} \quad (5)$$

This quantity is minimum when the vectors are identical.

Normalized Correlation $$R(l_1, l_2) = \frac{l_1 \cdot l_2}{\sqrt{(l_1 \cdot l_1)(l_2 \cdot l_2)}} \quad (6)$$

This quantity is maximum when the vectors are parallel.

In Eqs. (3) and (5), we are summing over all the k dimensions of the transformed domain.

The algorithm which we have found most satisfactory to date for clustering is the Weighted Euclidean Distance measure (Eq. 5). There are many ways the weights $w_k$ of the vector components $l_x(k)$ can be chosen: for example, for the dimensionally reduced Fourier transform signal, each dimension k represents a physical angular component of the reflected beam collected by the microscope. A certain angular component is emphasized by increasing the weight $w_k$ corresponding to that component. Moreover, $w_k$ may be chosen statistically by weighting $w_k$ inversely proportional to the variance of the $k^{th}$ dimension over a predetermined set of prototype signals. This pattern recognition approach is summarized in FIG. 5.

Thus the clustering process involves the following:
1. Obtain an x-z plot.
2. Optionally, the x-z plot is Fourier transformed along the z-axis. This Fourier transform reduces the vector dimension of signal $l_x$ (at each horizontal location x).
3. One or more prototypes representing $l_{resist}$ (or $l_{trench}$) are selected from the transformed x-z plot for calculating the centroid $l_{resist,centroid}$ (or $l_{trench,centroid}$) of class $l_{resist}$ (or $l_{trench}$).
4. In the preferred method, the weighted Euclidean distance $d_x$ between the line signal $l_x$ or region signal $l_x^R$ and the chosen class centroid $l_{resist,centroid}$ (or $l_{trench,centroid}$) is calculated (Eq. 5); $d_x$ is normalized and plotted as a function of x, providing a similarity curve as shown in FIG. 3C and FIG. 6.

The minimum and maximum values represent trenches and lines, or vice versa. By measuring the distance between the points in adjacent peaks of the curve along a line which is parallel to the abscissa of the curve, which, for example, is labeled x ($\mu$m) in FIG. 6. The width of a trench or line is then obtained from the measured distance between the peaks or troughs of the similarity curve. In FIG. 6, the width of the resist strip (or trench) is taken to be the width between the 50% points of the normalized distance measure. Without prior knowledge of the cluster distribution, the width of the resist lines or trenches is just taken at the plane equidistant from the two clusters. Thus, we have classified the two regions, the trench and the line, into two clusters. The surface between these two clusters is the plane equidistant from the two clusters.

The other cluster methods, equations (3), (4) and (6), can be used to find a similarity curve which is a function of x. The curve would be of the type illustrated and the analysis similar.

There are various ways to improve the current clustering algorithm. For example, the estimation of the centroids $l_{resist,centroid}$, $l_{trench,centroid}$ of the two clusters $l_{resist}$ and $l_{trench}$ in step (3) may be improved by iteration. After running through steps (1) through (4), better locations of the lines and trenches is obtained and therefore, the prototypes representing the lines and trenches can be better selected. Then the process can be repeated to produce improved results.

In step (4), width measurement by thresholding the Euclidean distance measurement is not very satisfactory and may introduce errors in partitioning the clusters. To avoid thresholding, one may first determine the distances $d_{x,trench}$ between $l_x$ and $l_{trench,centroid}$ and $d_{x,resist}$ between $l_x$ and $l_{resist,centroid}$ and then measure the linewidths from the x-locations where $d_{x,resist} = d_{x,trench}$.

The method described above was used with the images obtained from a confocal microscope. FIG. 7 shows a linescan at the bottom focus of a dense resist line structure (1 $\mu$m tall). The line structures cannot be observed when an intensity linescan is obtained by traditional thresholding. Using the clustering method in accordance with the invention, the distance measure shows clearly the dense line structures because the information contained in all focus locations are utilized.

FIG. 8 shows the measurement results on a 0.5 $\mu$m thick E-beam resist wafer with dense line structures of varying widths. The measurements were obtained with a coherence microscope—the Mirau Correlation Microscope. The diamonds show the measured widths obtained by thresholding the intensity linescans at the trenches and the circles are the results obtained by the clustering algorithm in accordance with this invention. The irregular measurement results below 0.6 $\mu$m are removed by the clustering technique. FIG. 9 shows another set of measured data (1.27 $\mu$m tall I-line resist wafer with dense line structures) acquired with a Mirau Correlation Microscope. Again line structures below 0.6 μm are recognized by the clustering technique but not by a traditional thresholdlug algorithm.

Similar improvement on the measurement data acquired by a confocal microscope has also been observed. A confocal microscope (Conquest 2000 by Prometrix Corp., Santa Clara, Calif.) was used to examine a focus/exposure wafer of dense photoresist lines on polysilicon. Different dies on the wafer were printed with different focus and exposure times so that the widths of the printed lines changed slightly from die to die. The acquired data were in the form of cloud plots as shown in FIG. 2B. The clustering technique was then applied to the cloud plots and the measurement results are shown in FIG. 10. Again, optical data produced by the clustering technique correlates much better with SEM results than those obtained by thresholding alone.

Although the present disclosure is mainly concerned with line-width measurements, the same clustering technique, with little modifications, may be applied to overlay metrology. In order to determine the alignment accuracy of two alignment marks—typically achieved by centering a single box inside a larger box (FIG. 11)—linescans are taken at several locations on the alignment structures to determine the center of mass of the two structures. However, it may sometimes be difficult to decide the axial focusing since the two box-like structures are likely to be of different heights. The clustering technique is very useful here since it does not require the knowledge of the focal location of the alignment structures. Furthermore, by utilizing the information from a range of z-values instead of from a single focus, the irregularities near the edges may be averaged out; thus, the center of mass may be determined more accurately.

It is apparent that the image data obtained by the CCD camera can be line scanned in various directions and locations to form cloud plots and provide line-width measurement at any desired location of the semiconductor device surface. It is also apparent that holes in masks as well as lines and trenches can be measured during processing of semiconductor devices.

What is claimed is:

1. The method of measuring line-widths of a structure on the surface of an object with an optical microscope comprising the steps of obtaining an intensity image of optical signals at a plurality of positions, each position defined by a horizontal position x along an x-axis and focus position z along a z-axis;

obtaining a cloud plot of said intensity images as a function of horizontal position x and focus position z;

linescanning said cloud plot in the z direction at positions along the horizontal line to provide linescan vectors;

clustering and classifying the linescan vectors into groups representing raised and non-raised portions on a surface of said structure on the surface of the object, including defining centroid of each group, and creating a similarity curve from the linescan vectors and centroids which is a function of position along the horizontal line wherein a first attribute of said curve indicates a raised surface and a second attribute of said curve indicates a non-raised surface; and measuring the distance between points in the similarity curve which are along a preselected line parallel to the abscissa of the similarity curve to give a measure of the width of the raised or non-raised surface.

2. The method as in claim 1 in which the raised surface is a line and the non-raised surface is a trench.

3. The method as in claim 1 in which the similarity curve is obtained by measuring the weighted Euclidian distance between the linescan vectors and the defined centroids.

4. The method as in claim 1 in which the similarity curve is obtained by taking the dot product of the linescan vectors and the centroids.

5. The method as in claim 1 in which the similarity curve is obtained by the similarity rule.

6. The method as in claim 1 in which the similarity curve is obtained by normalized correlation.

7. The method as in claim 1, 2, 3, 4, 5 or 6 in which the linescan vectors are transformed prior to clustering and classification.

8. The method as in claim 7 in which the linescan vectors are transformed by Fourier transform prior to clustering and classification.

9. The method as in claim 1 including the step of forming a plurality of cloud plots along different lines of the image and providing measurements of surface features by clustering and classification.

10. The method of claim 1 wherein said first attribute of said curve is a minimum and said second attribute of said curve is a maximum.

11. The method of claim 1 wherein said first attribute of said curve is a maximum and said second attribute of said curve is a minimum.

12. The method of measuring line-widths of a surface of a semiconductor device with an optical microscope comprising the steps of obtaining optical images of the surface of said semiconductor device, said optical images having intensity signals representing the surface of the semiconductor device as the semiconductor device is moved in a z direction, and forming from said optical images a cloud plot, which represents intensity of said optical images as a function of a position x along a horizontal line and a focus position z along a z-axis, obtaining linescans from said cloud plot at various focus positions z for a given position x from an area surrounding a focal spot and weighing said linescans to obtain a linescan column vector, obtaining linescan column vectors at different positions x along the horizontal line, clustering and classifying the linescan column vectors into groups representing lines and trenches by defining a centroid of each group and creating a similarity curve from the linescan column vectors and the centroids, said similarity curve being a function of position along the horizontal line wherein a first attribute of said curve indicates a line and a second attribute of said curve indicates a trench, measuring the distance between adjacent points in the similarity curve which are along a selected line parallel to the horizontal line to give a measure of the width of the line or trench.

13. The method as in claim 12 in which the similarity curve is obtained by measuring the weighted Euclidian distance between the linescan column vectors and the defined centroids.

14. The method as in claims 12 or 13 in which the linescan vectors are transformed prior to clustering and classification.

15. The method as in claim 14 in which the linescan vectors are transformed by Fourier transform prior to clustering the classification.

16. The method as in claim 12 including the step of forming a plurality of cloud plots along different lines of the optical images and providing measurements of surface features by clustering and classification.

17. The method of claim 12 wherein said first attribute of said curve is a minimum and said second attribute off said curve is a maximum.

18. The method of claim 12 wherein said first attribute of said curve is a maximum and said second attribute of said curve is a minimum.

19. A method of measuring line-widths of a structure on the surface of an object with an optical microscope comprising the steps of:
   obtaining an intensity image of optical signals at a plurality of positions, each position defined by a horizontal position x along a horizontal line and a focus position z;
   linescanning a cloud plot of the intensity images in the z direction at each position x to provide linescan vectors,
   clustering and classifying said linescan vectors into groups, said groups representing raised and non-raised portions on said structure on the surface of the object, including
   defining a centroid of each group, and
   creating a similarity curve from the linescan vectors and centroids which is a function of position along the horizontal line wherein a minimum of said curve indicates a raised surface and a maximum of said curve indicates a non-raised surface,
   reiterating the clustering and classifying step by using an improved estimate of the centroid of each group, and
   measuring a width of said raised and non-raised portions from said similarity curve.

20. A method of claim 19 wherein the step of measuring a width of the raised and non-raised portions further includes:
   measuring a distance between points in the similarity curve which are along a preselected line parallel to the abscissa of the similarity curve to give a measure of the width of the raised or non-raised surface.

21. A system for measuring line-widths of a structure on the surface of an object comprising:
   a translation stage that moves in any of three mutually perpendicular directions;
   image acquisition means for acquiring an optical image at a plurality of positions, each position representing at least a portion of the object, wherein each optical image is converted to a binary signal and multiple bits of the binary signal represent a picture element of the optical image;
   storage means for storing bits of the binary signal;
   a cloud plot generator for generating a cloud plot from the optical images;
   linescan vector generator to linescan the cloud plot and store optical image intensities in vector form at each linescanned position;
   clustering and classifying means for data clustering and classifying the vectors into groups representing raised and non-raised structures on the surface of the object and generating a similarity curve; and
   output display means for displaying the distance between two preselected points on the similarity curve to represent the width of the raised or non-raised structures.

* * * * *